United States Patent
Kamiya

[11] Patent Number: 6,040,724
[45] Date of Patent: Mar. 21, 2000

[54] BUS DRIVER CIRCUIT HAVING ADJUSTABLE RISE AND FALL TIMES

[75] Inventor: Hiroshi Kamiya, Tokyo, Japan

[73] Assignee: NEC Corporation, Tokyo, Japan

[21] Appl. No.: 08/713,840

[22] Filed: Sep. 13, 1996

Related U.S. Application Data

[63] Continuation of application No. 08/323,776, Oct. 17, 1994, Pat. No. 5,589,789.

[30] Foreign Application Priority Data

| Oct. 16, 1993 | [JP] | Japan | 5-281904 |
| Oct. 26, 1993 | [JP] | Japan | 5-266821 |
| Dec. 2, 1993 | [JP] | Japan | 5-352432 |

[51] Int. Cl.⁷ .................................................. H03K 5/12
[52] U.S. Cl. .......................... 327/170; 327/134; 327/394; 327/395
[58] Field of Search ................................. 327/134, 170, 327/263, 264, 270, 276, 278, 393, 394, 395, 396, 400

[56] References Cited

U.S. PATENT DOCUMENTS

| 4,363,934 | 12/1982 | Scholz | 179/1 VL |
| 4,490,626 | 12/1984 | Carlson | 327/408 |
| 4,694,197 | 9/1987 | Sprague | 327/270 |
| 4,737,670 | 4/1988 | Chan | 327/278 |
| 4,914,319 | 4/1990 | Hashimoto | 327/379 |
| 5,210,450 | 5/1993 | Parkinson | 327/269 |
| 5,220,216 | 6/1993 | Woo | 327/278 |
| 5,317,207 | 5/1994 | Mortensen . | |
| 5,319,258 | 6/1994 | Ruetz | 327/278 |
| 5,327,031 | 7/1994 | Marbot et al. | 327/276 |
| 5,465,062 | 11/1995 | Fong | 327/393 |
| 5,477,179 | 12/1995 | Takada et al. | 327/270 |
| 5,521,540 | 5/1996 | Marbot | 327/276 |

FOREIGN PATENT DOCUMENTS 2-122725  5/1990  Japan .

*Primary Examiner*—Timothy P. Callahan
*Assistant Examiner*—Jung Ho Kim
*Attorney, Agent, or Firm*—Whitham, Curtis & Whitham

[57] ABSTRACT

A bus driver circuit for high speed data transmission includes a plurality of delay blocks connected in series one to another which varies a rise and fall time of an input signal in order to shape an output waveform. Each block includes one or more delay elements for providing a predetermined delay period. A selector input is provided for each delay block such that one or more of the predetermined delay periods can be selected. Hence, the rise and fall time of the input signal can be varied depending upon which block or combination of blocks have been selected to shape the resultant waveform. An output circuit is also included which superimposes the input signal on the resultant output waveform.

17 Claims, 12 Drawing Sheets

$Z1 = 35.2 \, \Omega$ $Z2 = 20.5 \, \Omega$ 6,040,724

BUS DRIVER CIRCUIT HAVING ADJUSTABLE RISE AND FALL TIMES

CROSS REFERENCE TO RELATED APPLICATIONS

This application is a continuation of U.S. patent application Ser. No. 08/323,776, filed Oct. 17, 1994, now U.S. Pat. No. 5,589,789.

BACKGROUND OF THE INVENTION

1. Field of the Invention

The present relates generally to bus driver circuit. More specifically, the invention relates to a bus driver circuit permitting adjustment of transition period of rising up and falling down of a transmitting data output and whereby realizing high speed transmission of the transmitting data.

2. Description of the Related Art

Conventional high speed bus driver for transmission of a transmitting data has different through rate (transition period in rising up of the transmitting data output) for efficiently performing high speed signal transmission depending upon the kind and nature of the data waveform to be transmitted, signal propagation speed and installation condition of other associated boards.

Accordingly, in order to perform signal transmission efficiency, it is necessary to select optimal through rate depending upon the kind and nature of the data waveform to be transmitted, signal propagation speed and installation condition of other associated boards.

However, the through rate of this type of bus driver is significantly depends on the performance of a transistor included therein. Therefore, the conventional bus driver circuit has no function for adjusting the through rate or has simple adjustment function discussed below.

One example of the conventional bus driver circuit which permits adjustment of the through rate, has been disclosed in Laid-Open application No. 2-122725. In this publication, there is a disclosure for the bus driver circuit, in which the through rate is adjusted by a control terminal and N-channel transistor and P-channel transistor In concrete, when a voltage of high potential (H) is applied to the control terminal, the N-channel transistor and the P-channel transistor are turned ON. By this, the N-channel of an inverter is strengthened so that the gate of the P-channel transistor may turn into low potential (L) at high speed. As set forth above, in this prior art, the through rate of the output buffer is adjusted.

Thus, the conventional bus driver circuit does not have the through rate adjusting function or has only a simple adjusting function. Therefore, it is not possible to efficiently perform high speed transmission of the data waveform at an optimal through rate depending upon the kind and nature of the data waveform to be transmitted, signal propagation speed and installation condition of other associated boards. Also, the foregoing conventional bus driver circuit having the through rate adjusting function, adjustment of the through rate is permitted between two levels. Therefore, in order to obtain optimal through rate, the design has to be differentiated per the system to apply.

Therefore, it has been desired a bus driver circuit which permits multi-level adjustment of the through rates.

Next, discussion will be given for the prior art in a signal output circuit for outputting a signal to be input to the bus driver circuit.

At first, in advance of discussion for the prior art, the general construction of a bus transmission path will be discussed with reference to the drawing, particularly to FIG. 12. As shown in FIG. 12, a plurality of bus transmission paths 303 are provided on a mother board 300. Also, on the mother board 300, a plurality of connectors 301 are mounted, To the connectors 301, substrates 302 are connected. Thus, the internal circuit of the substrates 302 are connected to the bus transmission paths. Each of the substrates 302 receives and transmits signals via the bus transmission paths.

A characteristic impedance of the bus transmission paths may be varied depending upon the various factors. A major factor to cause variation in the number of substrates to be installed to the connector 301 is yield in fabrication. Amongst, discussion will be given for variation of the impedance with reference to the drawing, particularly to FIG. 12, In the construction of the bus transmission path as illustrated in FIG. 12, the number of substrate 302 to be connected to the bus transmission path 303 is not constant. For example, in FIG. 13, only substrates 302 at both ends are connected to the connector 301. Therefore, number of the substrate is two. On the other hand, in FIG. 14, the number of the substrate to be installed becomes seven.

By variation of the number of the installed substrates, the characteristic impedance of the bus transmission path 303 is varied. In order to show this, the approximated characteristic impedances of respective constructions of FIGS. 13 and 14 are calculated.

In the bus transmission path of the construction shown in FIG. 12, it is assumed that the distance between the connectors 301 is 1 inch (2.54 cm), the characteristic impedance of the bus transmission path in the case where no substrate is installed is Z0:0.75 Ω and propagation delay period is t=7 ns/m. At this time, an inductance component L0 and capacitance component C0 are approximately calculated as 13.5 nH/inch and 2.36 Pf/inch.

Here, assuming that 25 pF of the capacitance component is increased per each substrate 302, the characteristic impedance Z1 of the bus transmission path 303 in the construction of FIG. 13 can be calculated as 32.2 Ω. On the other hand, the characteristic impedance Z2 of the bus transmission path 303 in the construction of FIG. 14 becomes 20.5 Ω. Namely. when the construction of FIG. 14 is constructed by adding five substrates 302 for the construction of FIG. 13, the characteristic impedance is lowered in the extent of 14.7 Ω.

In the discussion given hereabove, variation of the characteristic impedance is theoretically calculated with employing approximation for simplification. However, in practice, it is difficult to predict variation of the characteristic impedance in advance of actual installation of the substrate. For example, the characteristic impedance may be variable not only depending upon the number of substrate to be installed in the bus transmission path but also depending upon the position of installation of the substrate. Thus, the characteristic impedance of the bus transmission path is variable depending upon various factors. Then, associating with variation of the characteristic impedance, the signal waveform to be propagated on the bus transmission path may be differentiated.

For example, in case of a pulse wave, when the characteristic impedance of the bus transmission path is excessively large, the rising up period of the pulse becomes long. On the other hand, when the characteristic impedance is too small, ringing may be caused. Ringing is a transitional vibration of the waveform to be caused by abrupt rising up of the pulse and can be a cause of malfunction.

Beside, in order to propagate signal at high speed, signal has to be maintained at constant waveform. Therefore, the characteristic impedance of the bus transmission path has to be corrected to be a given constant value.

One example of the conventional signal output circuit having an adjusting function for the characteristic impedance of the bus transmission path is shown in FIG. 15. With reference to FIG. 15, between the output portion 311 for outputting the signal and the bus transmission path 333, a resistor 351 is connected. In this signal output circuit, by varying the resistance of the resistor 351, the characteristic impedance is adjusted to shape the signal waveform into a desired shape. The resistance of the resistor 351 is determined depending upon the characteristic impedance of the bus transmission path 333.

However, in the above-mentioned conventional signal output circuit, when the characteristic impedance is varied by modification of the installation condition of the substrates in the bus transmission path, it becomes necessary to exchange the resistor per se in order to vary the resistance value to make handling cumbersome.

Also, as set forth above, it is difficult to even theoretically predict the characteristic impedance of the bus transmission path. Therefore, the resistance value of the resistor to be employed in the signal output circuit has to be obtained through experiments. At this time, it is required to repeat cumbersome operation to exchange the resistors.

SUMMARY OF THE INVENTION

It is the first object of the present invention to provide a bus driver circuit which can solve the problems set forth above, and permits selection of an optimal through rate for enabling efficient and high speed transmission of data depending upon the kind and nature of the data waveform to be transmitted, signal propagation speed and installation condition of other associated boards.

Second object of the present invention is, in addition to the foregoing first object, to provide a signal output circuit for obtaining a resistance value depending upon a characteristic impedance of a bus transmission path with simple operation.

According to the first aspect of the invention, a bus driver circuit comprises:

a plurality of MOS transistors connected in series between a data input terminal and a data output terminal, and a plurality of controlling MOS transistors;

sources of the plurality of MOS transistors being connected to drains of the plurality of controlling MOS transistors; and gates of the plurality of MOS controlling transistors to control signal source means for selectively turning ON and OFF the plurality of controlling transistors.

Preferably, N in number of the MOS transistors and M in number of controlling MOS transistors are provided, in which M is smaller than N;

drains of first to Nth MOS transistors are connected to the data output terminal and gates thereof are connected to the data input terminal;

sources of first to Mth controlling MOS transistors are connected to the drains of first to Mth MOS transistors; and gates of (M+1)th to Nth MOS transistors are connected to the ground;

the gates of the first to Mth controlling MOS transistors are connected to the control signal source means to respectively receive first to Mth control signals for turning ON and OFF the first to Mth controlling MOS transistors; and the sources of the first to Mth controlling MOS transistors are connected to the ground.

Between the sources of the first to Mth controlling MOS transistors and the ground, first to Mth resistors may be connected, respectively.

According to the second aspect of the invention, a bus driver circuit comprises:

a plurality of NPN transistors connected in series between a data input terminal and a data output terminal, and a plurality of controlling NPN transistors;

sources of the plurality of NPN transistors being connected to drains of the plurality of controlling NPN transistors; and gates of the plurality of NPN controlling transistors to control signal source means for selectively turning ON and OFF the plurality of controlling transistors.

In the preferred construction, N in number of the NPN transistors and M in number of controlling NPN transistors are provided, in which M is smaller than N;

drains of first to Nth NPN transistors are connected to the data output terminal and gates thereof are connected to the data input terminal;

sources of first to Mth controlling NPN transistors are connected to the drains of first to Mth NPN transistors; and gates of (M+1)th to Nth NPN transistors are connected to the ground;

the gates of the first to Mth controlling NPN transistors are connected to the control signal source means to respectively receive first to Mth control signals for turning ON and OFF the first to Mth controlling NPN transistors; and the sources of the first to Mth controlling NPN transistors are connected to the ground.

Between the sources of the first to Mth controlling NPN transistors and the ground, first to Mth resistors may be connected, respectively.

According to the third aspect of the invention, a device driver circuit comprises:

an input terminal inputting an input signal;

a delay circuit for outputting a delayed signal generated by delaying the input signal from the input terminal for a selected one of a plurality of preset delay periods;

an output circuit for outputting an output signal with superimposing the input signal from the input terminal and the delayed signal from the delay circuit; and an output terminal outputting the output signal from the output circuit.

The delay circuit may include a plurality of delay elements and selection means for selecting one or more delay elements among a plurality of delay elements in arbitrary combination. The selection means may comprise a selector which received a signal past through at least one delay elements and a signal not past through the delay element, and selectively output one of the signals.

The output circuit may include first NPN transistor having base connected to the input terminal, emitter is connected to the ground and collector, and second NPN transistor which has base connected to the delay circuit, emitter is connected to the ground and the collector is connected to the output terminal. The output circuit may include first MOS transistor having base connected to the input terminal, emitter is connected to the ground and collector, and second MOS transistor which has base connected to the delay circuit, emitter is connected to the ground and the collector is connected to the output terminal.

According to the fourth aspect of the invention, a signal output device comprises:

an output portion for outputting a signal to a bus transmission line; and a variable impedance position provided between the output portion and the bus transmission line and generates an arbitrary impedance.

The variable impedance means may include a resistor for adding resistance for the signal output from the output portion and including variable resistor portion arbitrary variable of the resistance value thereof. The variable resistor portion may comprise a resistor connected in parallel and having mutually distinct resistance values, and a selector for selecting one of a plurality of the resistors. Also, the variable resistor may include a plurality of resistors; and selection means for selecting one or more resistors in an arbitrary combination among a plurality of registers.

The selection means may be a selector receiving a signal past through at least one resistor and a signal not past through the signal processing means and selecting one of the signals.

The variable resistance portion may include the plurality of resistors having mutually different resistances. The variable resistor portion may include a plurality of resistor blocks generating a predetermined resistance value at a specific pattern of input selection signal and becoming conductive at other patterns of the input selection signal. The plurality of resistor blocks may be connected in series. Also, the plurality of resistor blocks may generate mutually different resistance values.

When a minimum resistance value among resistance values of a plurality of resistor blocks is taken as minimum resistance value, respective resistance values of the plurality of resistor blocks are powers of 2 of the minimum resistance value. Also, the plurality of resistance blocks includes a first resistance block having the minimum resistance value and a second resistance block having a resistance value twice of the minimum resistance value.

According to a fifth aspect of the invention, a bus driver circuit comprises:

a plurality of MOS transistors connected in series between a data input terminal and a data output terminal, a plurality of controlling MOS transistors, and a signal output circuit having an output portion for generating a signal and a variable impedance means for arbitrarily generating impedance;

source of the plurality of MOS transistors being connected to drains of the controlling MOS transistors;

gates of the plurality of controlling MOS transistors being connected to a control signal source for receiving a plurality of control signals respectively for selectively turning ON and OFF the plurality of controlling MOS transistors; and the data input terminal being connected to the signal output circuit.

According to a sixth aspect of the invention, a bus driver circuit comprises:

a plurality of NPN transistors connected in series between a data input terminal and a data output terminal, a plurality of controlling NPN transistors, and a signal output circuit having an output portion for generating a signal and a variable impedance means for arbitrarily generating impedance;

source of the plurality of NPN transistors being connected to drains of the controlling NPN transistors;

gates of the plurality of controlling NPN transistors being connected to a control signal source for receiving a plurality of control signals respectively for selectively turning ON and OFF the plurality of controlling NPN transistors; and the data input terminal being connected to the signal output circuit.

According to a seventh aspect of the invention, a device driver circuit comprises:

an input terminal for inputting an input signal;

a delay circuit for outputting a delayed signal generated by delaying the input signal from the input terminal for a selected one of a plurality of preset delay periods;

an output circuit for outputting an output signal with superimposing the input signal from the input terminal and the delayed signal from the delay circuit;

an output terminal outputting the output signal from the output circuit; and a signal output circuit having an output portion for outputting a signal and a variable impedance means for arbitrarily generating an impedance, the signal output circuit being connected to the input terminal.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed hereinafter with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
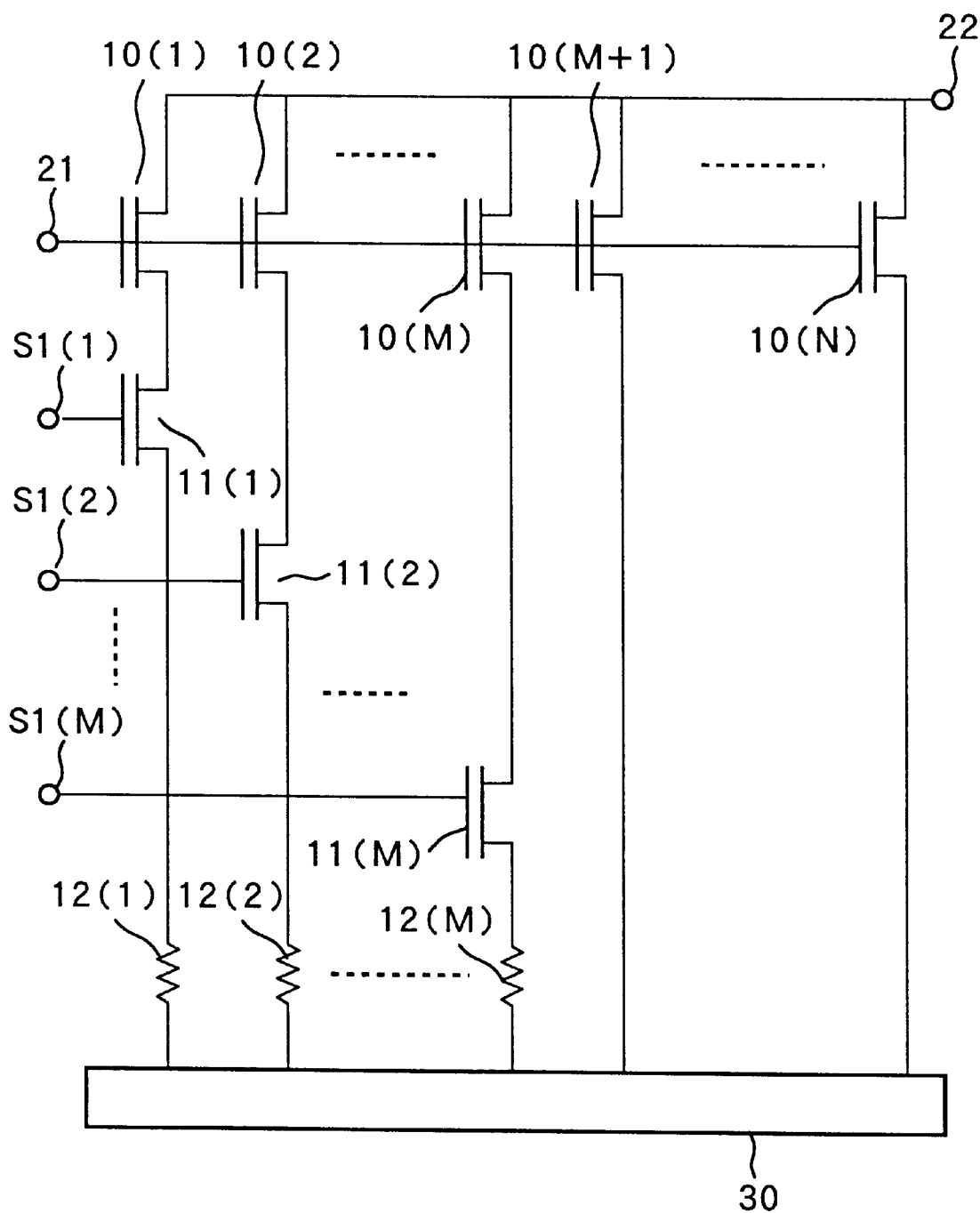
FIG. 1 is a circuit diagram showing a construction of the first embodiment of a bus driver circuit according to the present invention.

FIG. 1 is a circuit diagram showing the construction of the first embodiment of a bus driver circuit according to the present invention.

In FIG. 1, the shown embodiment of a bus driver circuit comprises first to Nth MOS transistors 10(1) to 10(N), first to Mth (M and N are integer greater than or equal to one, M<N) controlling MOS transistors 11(1) to 11(M) and the first to Mth resistors 12(1) to 12(M).

The drains of the first to Mth MOS transistor 10(1) to 10(M) are connected to a transmitting data output terminal 22. The gates of the first to Nth MOS transistors 10(1) to 10(M) are connected to a transmitting data input terminal 21. On the other hand, the source of the first to Nth MOS transistors 10(1) to 10(M) are connected to the drains of the first to Mth controlling MOS transistors 11(1) to 11(M).

The drains of the (M+1)th to Nth MOS transistors 10(M+1) to 10(N) are connected to the transmitting data output terminal 22, and the gates thereof are connected to the transmitting data input terminal 21. Also, the sources of the (M+1)th to Nth MOS transistors 10(M+1) to 10(N) are connected to the grounding terminal 30.

The gates of the first to Mth controlling MOS transistors 11(1) to 11(M) are connected to the first to Mth control signal inputs S1(1) to S1(M), the sources thereof are connected to one terminals of the first to Mth resistors 12(1) to 12(M). The other terminals of the first to Mth resistors 12(1) to 12(M) are connected to the grounding terminal 30. The first to Mth controlling MOS transistors 11(1) to 11(M) are adapted to be set ON state and OFF state by the first to Mth control signals input through control signal inputs S1(1) to S1(M).

The DC characteristics (static characteristics) of the drains at the ON state of first to Mth MOS transistors 10(1) to 10(M), becomes LOW output characteristics by the combination of the characteristics of the first to Mth resistors 12(1) to 12(M), the first to Mth controlling MOS transistors 11(1) to 11(M) and the first to Mth MOS transistors 10(1) to 10(M) by the first to Mth control signals input through control signal inputs S1(1) to S1(M) when the first to Mth controlling MOS transistors 11(1) to 11(M) are in ON state in response to the first to Mth control signals S1(0) to S1(M). On the other hand, the first to Mth controlling MOS transistors 11(1) to 11(M) are in OFF state in response to the first to Mth control signals input through the control signal inputs S1(1) to S1(M), the DC characteristics of the drains becomes HIGH output characteristics.

The DC characteristics of the drains at OFF state of the first to Mth MOS transistors 10(1) to 10(M) is HIGH output characteristics irrespective of the first to Mth control signals input through the control signal inputs S1(1) to S1(M). When the (M+1)th to Nth MOS transistors 10(M+1) to 10(N) are in the ON state, the DC characteristics of the drains of the (M+1)th to Nth MOS transistors 10(M+1) to 10(N) are held fixed (not varied).

The HIGH level output in the transmitting data output terminal 22 is realized at the OFF states of the first to Nth MOS transistors 10(1) to 10(N). At this time, the DC characteristics thereof are held fixed.

On the other hand, LOW level output in the transmitting data output terminal 22 is realized at ON states of the first to Nth MOS transistors 10(1) to 10(N). At this condition, M+1 types of DC characteristics can be obtained depending when all of the first to Mth controlling MOS transistors 11(1) to 11(M) are in OFF state and when one to M in number of first to Mth controlling MOS transistors 11(1) to 11(M) are in ON state.

When the DC characteristics at the LOW level output in the transmitting data output terminal 22 is varied, the through rate, namely a rise-up transition period and fall-down transition period of the transmitting data, at the transmitting data output terminal 22 is varied depending upon variation of the DC characteristics. Accordingly, at the LOW level output of the transmitting data output terminal 22, by appropriately adjusting number of the transistors in ON state between "0" to "M" among first to Mth controlling MOS transistors 11(1) to 11(M), M+1 types of rise-up transition periods and fall-down transition periods can be set.

Figure 2:
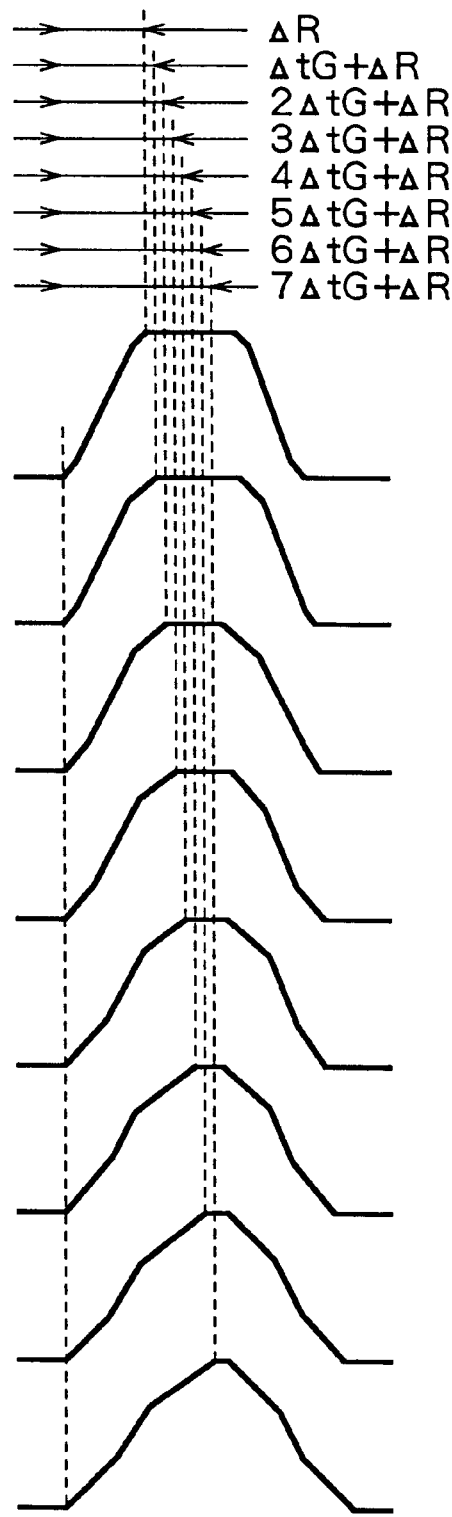
FIG. 2 is a timing chart showing the operation of the first embodiment of the bus driver circuit according to the present invention.

Here, the relationship between the ON/OFF state of the first to Mth controlling MOS transistors 11(1) to 11(M) and the rise-up transition period and the fall-down transition period is illustrated in FIG. 2. Assuming that gate delays at all of the first to Nth MOS transistors (1) to (N) are equal to each other, which delay period is $\Delta tG$, and the rise-up period of the transmitting data at the (M+1)th to Nth MOS transistors 10(M+1) to 10(N) are $\Delta tG$, the practical rise-up period of the transmitting data of the transmitting data output terminal 22 is expressed by $X\Delta tG+\Delta R$. Here, X is number of the controlling MOS transistors held ON among the first to Mth controlling MOS transistors 11(1) to 11(M). As can be appreciated from FIG. 2, according to increasing of number of controlling MOS transistors 11(1) to 11(M) held ON, the output waveform of the transmitting data output terminal 22 becomes sharper.

As set forth above, with the bus driver circuit of the shown embodiment, selection of the optimal rise-up transition period and the fall-down transition period for effective and high speed data transmission becomes possible.

It should be appreciated that, in FIG. 1, concerning the first to Nth MOS transistors (1) to (N), it is not always necessary to be provided in plural. Also, as (M+1)th to Nth MOS transistors 10(M+1) to 10(N), it is possible to provide only one MOS transistor. Also, the first to Mth resistors 12(1) to 12(M) may be neglected.

Figure 3:
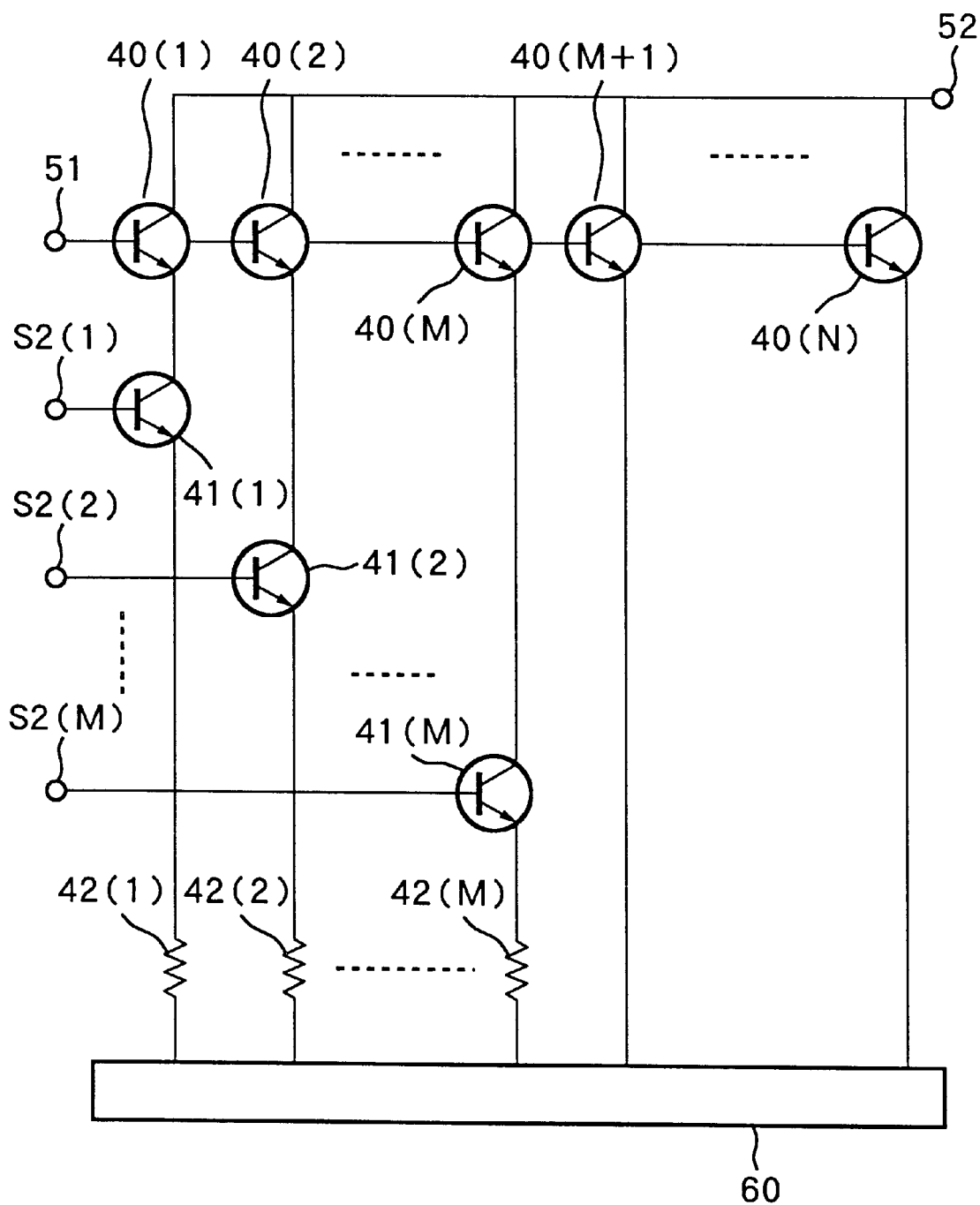
FIG. 3 is a circuit showing the construction of the second embodiment of a bus driver circuit according to the invention.

FIG. 3 is a circuit diagram showing the second embodiment of a bus driver circuit according to the invention.

In FIG. 3, the shown embodiment of a bus driver circuit comprises first to Nth NPN transistors 40(1) to 40(N), first to Mth (M and N are integer greater than or equal to one, M<N) controlling NPN transistors 41(1) to 41(M) and the first to Mth resistors 42(1) to 42(M).

The drains of the first to Mth NPN transistor 40(1) to 40(M) are connected to a transmitting data output terminal 52. The gates of the first to Nth NPN transistors 40(1) to 40(M) are connected to a transmitting data input terminal 51. On the other hand, the source of the first to Nth NPN transistors 40(1) to 40(M) are connected to the drains of the first to Mth controlling NPN transistors 41(1) to 41(M).

The drains of the (M+1)th to Nth NPN transistors 40(M+1) to 40(N) are connected to the transmitting data output terminal 52, and the gates thereof are connected to the transmitting data input terminal 51. Also, the sources of the (M+1)th to Nth NPN transistors 40(M+1) to 40(N) are connected to the grounding terminal 60.

The gates of the first to Mth controlling NPN transistors 41(1) to 41(M) are connected to the first to Mth control signal inputs S1(1) to S1(M), the sources thereof are connected to one terminals of the first to Mth resistors 42(1) to 42(M). The other terminals of the first to Mth resistors 42(1) to 42(M) are connected to the grounding terminal 60. The first to Mth controlling NPN transistors 41(1) to 41(M) are adapted to be set ON state and OFF state by the first to Mth control signals input through control signal inputs S1(1) to S1(M).

The DC characteristics (static characteristics) of the drains a the ON state of first to Mth NPN transistors 40(1) to 40(M), becomes LOW output characteristics by the combination of the characteristics of the first to Mth resistors 42(1) to 42(M), the first to Mth controlling NPN transistors 41(1) to 41(M) and the first to Mth NPN transistors 40(1) to 40(M) by the first to Mth control signals input through control signal inputs S1(1) to S1(M) when the first to Mth controlling NPN transistors 41(1) to 41(M) are in ON state in response to the first to Mth control signals S1(0) to S1(M). On the other hand, the first to Mth controlling NPN transistors 41(1) to 41(M) are in OFF state in response to the first to Mth control signals input through the control signal inputs S1(1) to S1(M), the DC characteristics of the drains becomes HIGH output characteristics.

The DC characteristics of the drains at OFF state of the first to Mth NPN transistors 40(1) to 40(M) is HIGH output characteristics irrespective of the first to Mth control signals input through the control signal inputs S1(1) to S1(M). When the (M+1)th to Nth NPN transistors 40(M+1) to 40(N) are in the ON state, the DC characteristics of the drains of the (M+1)th to Nth NPN transistors 40(M+1) to 40(N) are held fixed (not varied).

The HIGH level output in the transmitting data output terminal 52 is realized at the OFF states of the first to Nth NPN transistors 40(1) to 40(N). At this time, the DC characteristics thereof are held fixed.

On the other hand, LOW level output in the transmitting data output terminal 52 is realized at ON states of the first to Nh NPN transistors 40(1) to 40(N). At this condition, M+1 types of DC characteristics can be obtained depending when all of the first to Mth controlling NPN transistors 41(1) to 41(M) are in OFF state and when one to M in number of first to Mth controlling NPN transistors 41(1) to 41(M) are in ON state.

When the DC characteristics at the LOW level output in the transmitting data output terminal 52 is varied, the through rate, namely a rise-up transition period and fall-down transition period of the transmitting data, at the transmitting data output terminal 52 is varied depending upon variation of the DC characteristics. Accordingly, at the LOW level output of the transmitting data output terminal 52, by appropriately adjusting number of the transistors in ON state between "0" to "M" among first to Mth controlling NPN transistors 41(1) to 41(M), M+1 types of rise-up transition periods and fall-down transition periods can be set.

Even in this embodiment, the gate delay period is added in the extent corresponding to the number of the controlling NPN transistors 41(1) to 41(M) to the gate delay period of the NPN transistors 40(1) to 40(M), according to increasing of number of controlling NPN transistors 41(1) to 41(M) held ON, the output waveform of the transmitting data output terminal 52 becomes sharper as in the former embodiment.

It should be appreciated that as the (M+1)th to Nth NPN transistors 40(M+1) to 40(N), it is possible to provide only one NPN transistor. Also, the first to Mth resistors 42(1) to 42(M) may be neglected.

As set forth above, with the first and second embodiments of the bus driver circuit, M+1 types of rise-up transition period and fall-down transition period can be set by appropriately adjusting number of the controlling transistors held ON. Therefore, optimal through rate depending upon the kind and nature of the data to be transmitted, the transmission speed and the installation condition of other associated boards can be set for enabling efficient and high speed data transmission. By this, the bus driver which can perform high speed data transmission can be realized.

Figure 4:
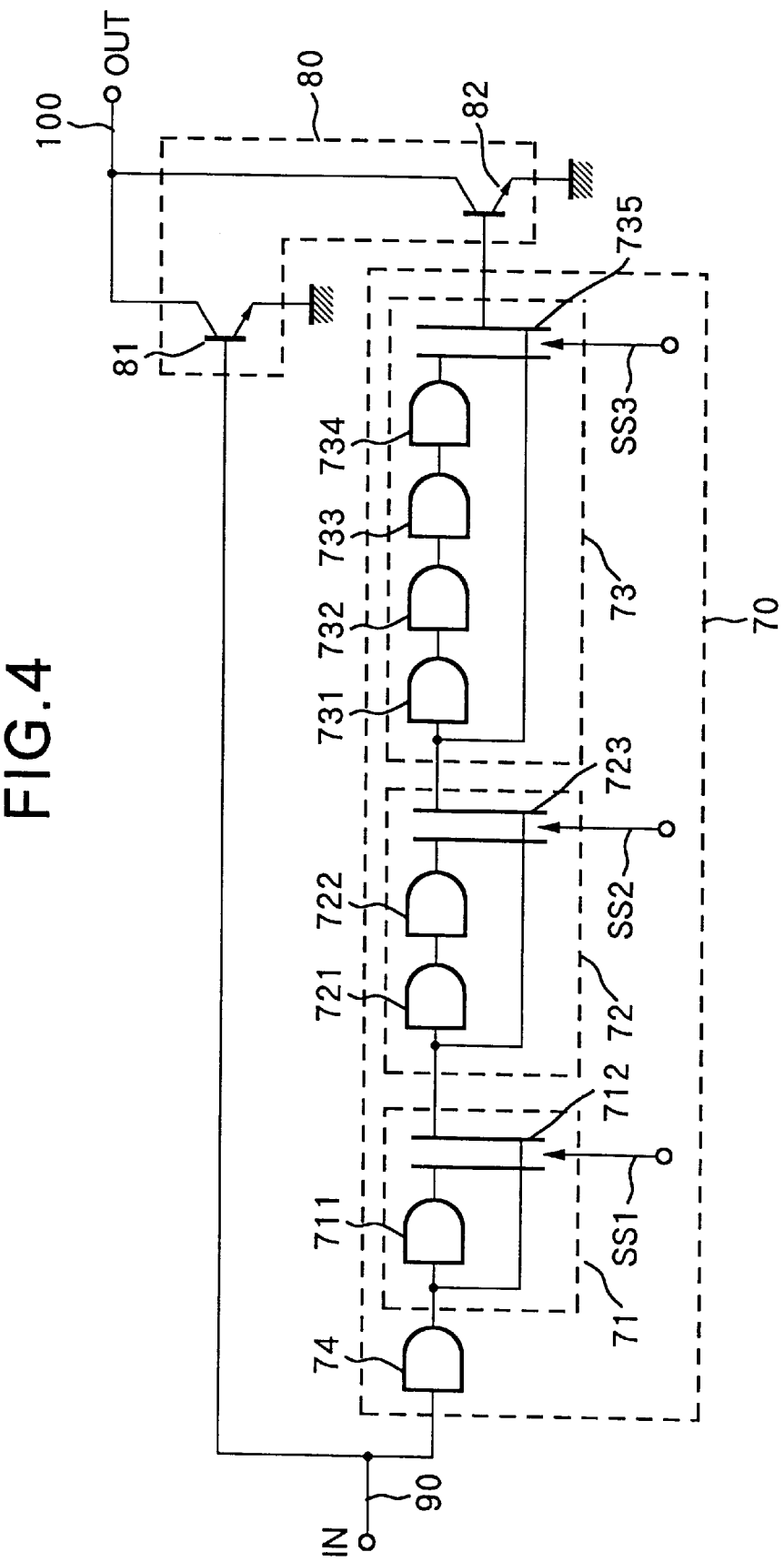
FIG. 4 is a circuit showing a construction of the third embodiment of a bus driver circuit according to the invention.

FIG. 4 is a circuit diagram showing the construction of the third embodiment of a bus driver circuit according to the present invention.

In FIG. 4, the shown embodiment of a bus driver circuit includes an input terminal 90, a delay circuit 70 for generating a delayed signal obtained by delaying an input signal IN provided to the input terminal 90, an output circuit 80 for superimposing the input signal IN and the delayed signal and an output terminal 100 for outputting an output data.

The delay circuit 70 comprises a delay element 74 and delay blocks 71, 72 and 73.

The delay block 71 includes a delay element 711, and a selector 712 for selecting one of the signal output from the delay element 711 and a signal bypassing the delay element 711 for outputting. The signal to be selected by the selector 712 is designated by an external selection signal SS1. When the external selection signal SS1 is low voltage=L, the selector 712 selects the signal bypassing the delay element 711. On the other hand, when the external selection signal SS1 is HIGH voltage=H, the output of the delay element 711 is selected.

The delay block 72 has delay elements 721 and 722 connected in series and a selector 723 for selecting one of the signal output from the delay elements 721 and 722 and a signal bypassing the delay elements 721 and 722. The signal to be selected by the selector 723 is designated by an external signal SS2. A gate delay period of the delay elements 721 and 722 is the same as the delay element 711. Accordingly, since the delay elements 721 and 722 are connected in series, the delay block 72 has twice longer delay period than the delay block 711.

The delay block 73 has delay elements 731, 732, 733 and 734 connected in series and a selector 735 for selecting one of the signal output from the delay elements 731, 732, 733 and 734 and a signal bypassing the delay elements 731, 732, 733 and 734. The signal to be selected by the selector 735 is designated by an external signal SS3. A gate delay period of the delay elements 731, 732, 733 and 734 is the same as the delay element 711. Accordingly, since the delay elements 731, 732, 733 and 734 are connected in series, the delay block 73 has four times longer delay period than the delay block 711.

The output circuit 80 comprises two NPN transistors 81 and 82. The base of the NPN transistor 81 is connected to the input terminal 90, the emitter is connected to the ground and the collector is connected to the output terminal 100. The base of the NPN transistor 82 is connected to the output of the delay circuit 70, the emitter is connected to the ground and the collector is connected to the output terminal 100. By this, the input signal IN input to the input terminal 90 and the delayed signal delayed by the delay circuit are output from the output terminal 100 in superimposing manner.

Next, discussion will be given for signal propagation in the delay circuit 70. In the following discussion, the external selection signals SS1 to SS2 are generally represented by a reference signal S. For instance, S=HLL represents that SS1, SS2 and SS3 are respectively H, L and L.

The input signal IN input to the input terminal 90 is input to the input portion of the delay element 74 and the base input portion of the NPN transistor 81.

The signal input to the input portion of the delay element 74 is delayed for the magnitude of the gate delay and fed to the input portion of the delay element 711 of the delay block 71 and to one input portion of the selector 12. The transmitting data input to the input of the delay element 711 is delayed for the magnitude of the gate delay of the delay element 711 and input to the other input portion of the selector 712. The signal input to the other input portion of the selector 712 via the delay element 711 is delayed for the magnitude corresponding to the gate delay of the delay element 711 in comparison with the signal input to the one input portion of the selector directly from the output portion of the delay element 74. Among two kinds of signals respectively from the delay element 74 and the delay element 711, the signal to be output is selected by the selector 712 depending upon an external selection signal SS1.

The signal selected by the selector 712 is input to the input portion of the delay element 721 and one input portion of the selector 735. The signal input to the input portion of the delay element 721 is input to the input portion of the delay element 722 from the output portion of the delay element 721 with a delay in a magnitude corresponding to the gate delay of the delay element 721. The signal input to the input portion of the delay element 722 is delayed for the magnitude corresponding to the delay period of the delay element 722 from the output portion of the delay element. The signal input to the other input portion of the selector 735 from the output portion of the delay element 722. The signal input to the other input portion of the selector 735 via the delay elements 721 and 722 is delayed for the gate delays of the delay elements 721 and 722. Among these output signal of the selector 712 and the output signal of the delay element 722, one is selected for outputting by the selector 735 on the basis of the external selection signal Ss2.

The signal selected by the selector 735 is input to the input portion of the delay element 731 and to the one input portion of the selector 712. the signal input to the input portion of the delay element 731 is delayed for the period corresponding to the gate delay of the delay element 731. The output of the delay element 731 is fed to the input portion of the input portion of the delay element 732. The signal input to the input portion 732 is provide a delay corresponding to the gate delay of the delay element 732. Then, the delayed signal output from the output portion of the delay element 732 is input to the input portion of the delay circuit 734. The signal input to the input portion 734 is provide a delay corresponding to the gate delay of the delay element 735. Then, the delayed signal output from the output portion of the delay element 734 is input to the input portion of the selector 735. The signal input to one input portion of the selector 735 via the delay elements 731 to 734 is delayed in the magnitude corresponding to the gate delay of the delay elements 731 to 734 with respect to the signal input to the other input portion of the selector from the output portion of the selector 723. One of these output signal of the selector 723 and the output signal of the delay element 734 is selected by the selector 735 depending upon the external selection signal SS3.

The transmitting data selected by the selector 735 is input to the base input portion of the NPN transistor 82 from the output portion of the selector 735.

Next, the operation of the shown embodiment of the bus driver device according to the present invention will be discussed with reference to the drawings.

FIGS. 5 to 8 are timing charts showing the operation of the shown embodiment of the bus driver circuit according to the present invention. Here, it is assumed that the gate delay of all of the delay elements, 74, 711, 721, 722, 731, 732, 733 and 734 are the same to each other, and the gate delay period is $\Delta tG$. Also, the delay of all of the selectors 712, 723 and 735 are the same to each other. A delay is assumed as $\Delta tG$. Furthermore, the gate delays of the NPN transistors 81 and 82 are also the same as each other. The rise-up period is assumed as $\Delta tR$.

Figure 5:
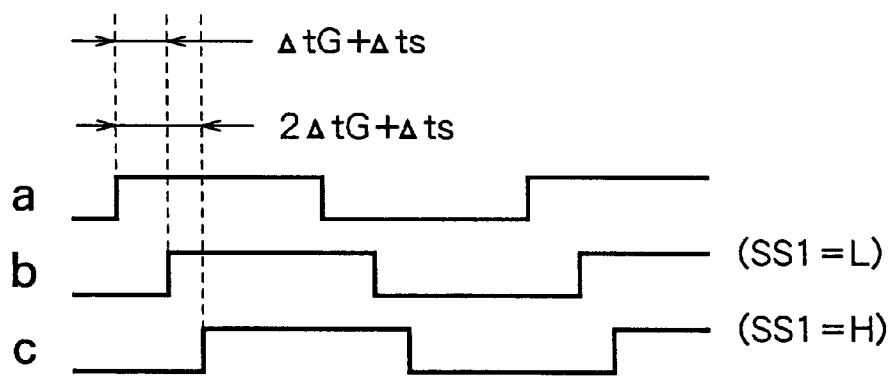
FIG. 5 is a timing chart showing the operation of the third embodiment of the bus driver circuit according to the present invention.

At first, there are two kinds of transmitting data to be input to the input portion of the delay element 721 from the selector 712 as shown in (b) and (c) of FIG. 5. The waveform shown in (b) of FIG. 5 is the waveform input to the input portion of the delay element 721, and the wave form shown in (c) of FIG. 5 is the waveform input from the input portion of the delay element 721 via the delay elements 74 and 711 and the selector 712. This waveform is obtained when SS1=H.

Comparing these waveforms with the waveform input to the base input portion of the NPN transistor 81 shown in (a) of FIG. 5, the delay of (b) of FIG. 5 to be obtained at SS1=L becomes "$\Delta tG+\Delta tS$". Also, the delay of (c) of FIG. 5 obtained at SS1=H becomes "$2\Delta tG+\Delta tS$".

Figure 6:
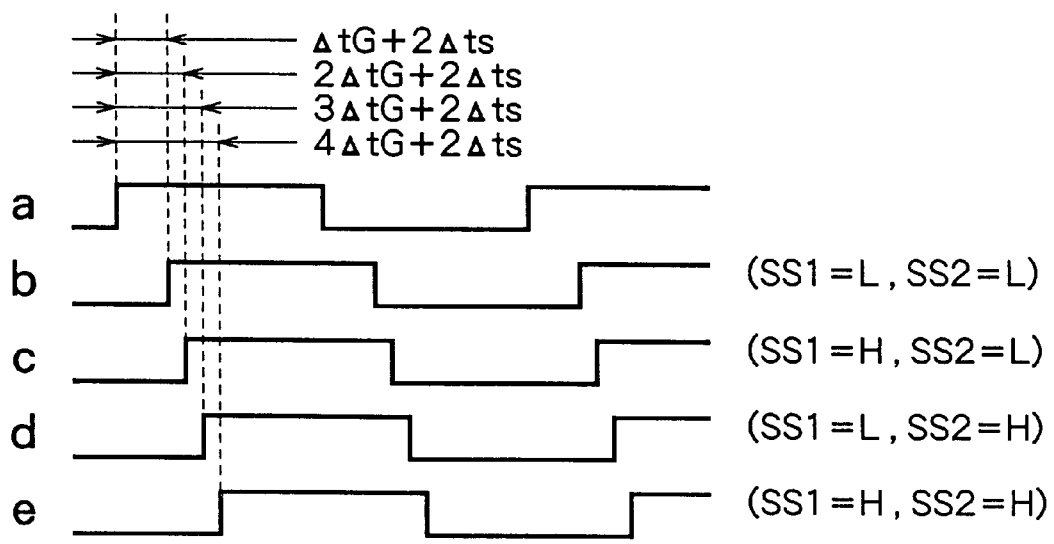
FIG. 6 is a timing chart showing the operation of the third embodiment of the bus driver circuit according to the present invention.

The waveforms input to the input portion of the delay element 731 from the output portion 723 are 4 kinds as illustrated in (b) to (e) of FIG. 6. The waveform of (b) of FIG. 6 is the waveform input to the input portion of the delay element 731 via the delay element 74 and the selectors 712 and 723. This waveform is obtained when SS1=L and SS2=L. The waveform of (c) of FIG. 6 is the waveform input to the input portion of the delay element 731 via the delay elements 74 and 711 and the selectors 712 and 723. This waveform is obtained when SS1=H and SS2=L. The waveform of (d) of FIG. 6 is the waveform input to the input portion of the delay element 731 via the delay elements 74 and 721 and the selectors 712 and 723. This waveform is obtained when SS1=L and SS2=H. The waveform of (e) of FIG. 6 is the waveform input to the input portion of the delay element 731 via the delay elements 74, 711 and 721 and the selectors 712 and 723. This waveform is obtained when SS1=H and SS2=H.

Comparing these waveforms with the waveform (see (a) of FIG. 6) input to the base input portion of the NPN transistor 81, delay of the waveform of (b) of FIG. 6 obtained at SS1=L and SS2=L becomes "ΔtG+2ΔtS". Delay of the waveform of (c) of FIG. 6 obtained at SS1=H and SS2=L becomes "2ΔtG+2ΔtS". Delay of the waveform of (d) of FIG. 6 obtained at SS1=L and SS2=H becomes "3ΔtG+2ΔtS". Delay of the waveform of (e) of FIG. 6 obtained at SS1=H and SS2=H becomes "4ΔtG+2ΔtS".

Figure 7:
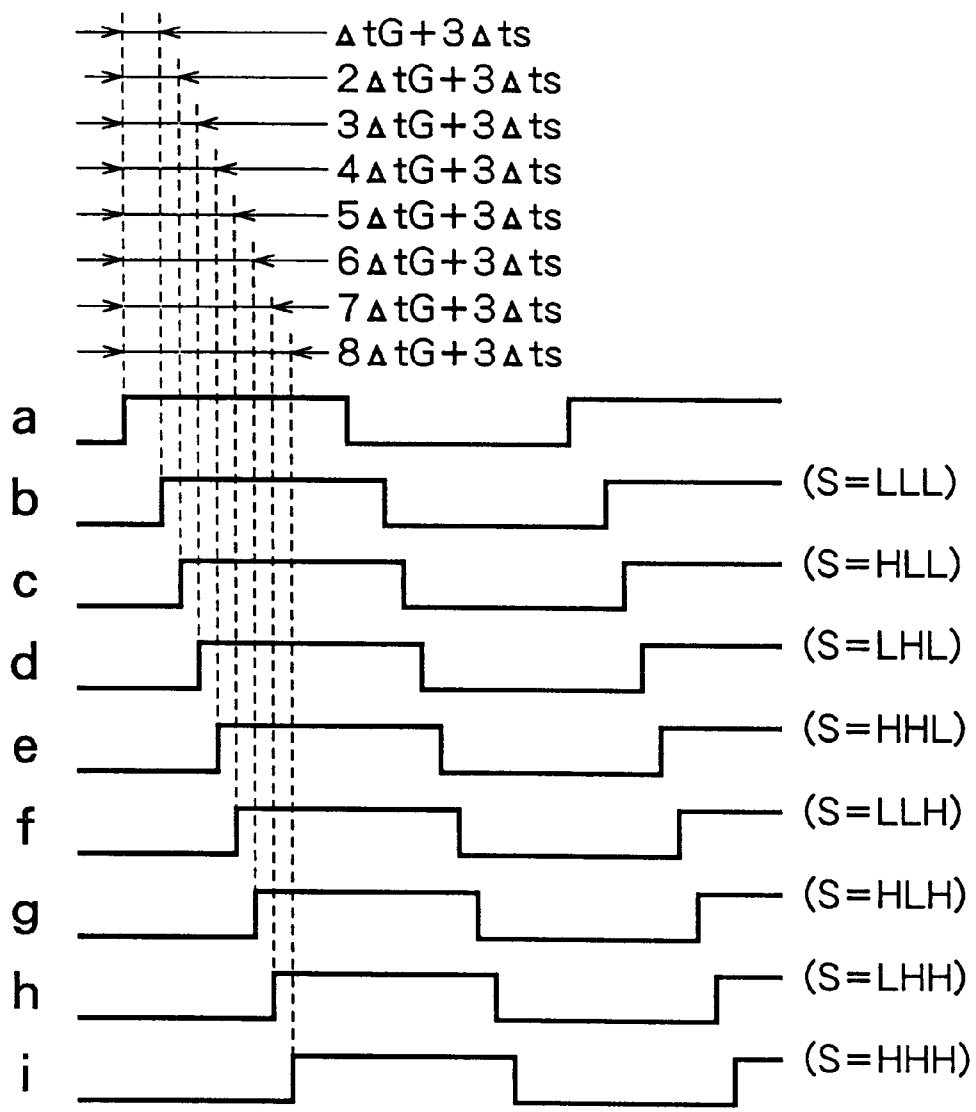
FIG. 7 is a timing chart showing the operation of the third embodiment of the bus driver circuit according to the present invention.

Next, there are eight kinds or types of waveforms in the waveforms input to the base input portion of the NPN transistor 82 from the output portion of the selector 735. The waveform shown in (b) of FIG. 7 is the wave form input to the base input portion of the NPN transistor 82 via the delay element 74 and selectors 712, 723 and 735. This waveform is obtained at S=LLL. The waveform shown in (c) of FIG. 7 is the wave form input to the base input portion of the NPN transistor 82 via the delay element 74 and 711 and selectors 712, 723 and 735. This waveform is obtained at S=HLL. The waveform shown in (d) of FIG. 7 is the wave form input to the base input portion of the NPN transistor 82 via the delay element 74 and 721 and selectors 712, 723 and 735. This waveform is obtained at S=LHL. The waveform shown in (e) of FIG. 7 is the wave form input to the base input portion of the NPN transistor 82 via the delay element 74, 711, 721 and 722 and selectors 712, 723 and 735. This waveform is obtained at S=HHL. The waveform shown in (f) of FIG. 7 is the wave form input to the base input portion of the NPN transistor 82 via the delay element 74, 731, 732, 733 and 734 and selectors 712, 723 and 735. This waveform is obtained at S=LLH. The waveform shown in (g) of FIG. 7 is the wave form input to the base input portion of the NPN transistor 82 via the delay element 74, 711, 731, 732, 733 and 734 and selectors 712, 723 and 735. This waveform is obtained at S=HLH. The waveform shown in (h) of FIG. 7 is the wave form input to the base input portion of the NPN transistor 82 via the delay element 74, 721, 722, 731, 732, 733 and 734 and selectors 712, 723 and 735. This waveform is obtained at S=LHH. The waveform shown in (i) of FIG. 7 is the wave form input to the base input portion of the NPN transistor 82 via the delay element 74, 711, 721, 722, 731, 732, 733 and 734 and selectors 712, 723 and 735. This waveform is obtained at S=HHH.

Comparing these wave forms with the input waveform to the base input portion of the NPN transistor 81, when S=LLL shown in (b) of FIG. 7, the delay of the waveform becomes "ΔtG+3ΔtS". When S=HLL shown in (c) of FIG. 7, the delay of the waveform becomes "2ΔtG+3ΔtS". When S=LHL shown in (d) of FIG. 7, the delay of the waveform becomes "3ΔtG+3ΔtS". When S=HHL shown in (e) of FIG. 7, the delay of the waveform becomes "4ΔtG+3ΔtS". When S=LLH shown in (f) of FIG. 7, the delay of the waveform becomes "5ΔtG+3ΔtS". When S=HLL shown in (g) of FIG. 7, the delay of the waveform becomes "5ΔtG+3ΔtS". When S=HLH shown in (g) of FIG. 7, the delay of the waveform becomes "6ΔtG+3ΔtS". When S=LHH shown in (h) of FIG. 7, the delay of the waveform becomes "7ΔtG+3ΔtS". When S=HHH shown in (i) of FIG. 7, the delay of the waveform becomes "8ΔtG+3ΔtS".

As set forth above, by controlling the selecting operation in the selectors 712, 723 and 735 by the external selection signal S=SS1 to SS3, eight kinds or types of (b) to (i) of FIG. 7 of waveforms, namely delay signal can be obtained. Depending upon eight kinds of delay signals, the eight kinds of waveforms shown in (b) to (i) of FIG. 8 can be obtained from the collector output portion of the NPN transistor 82.

Figure 8:
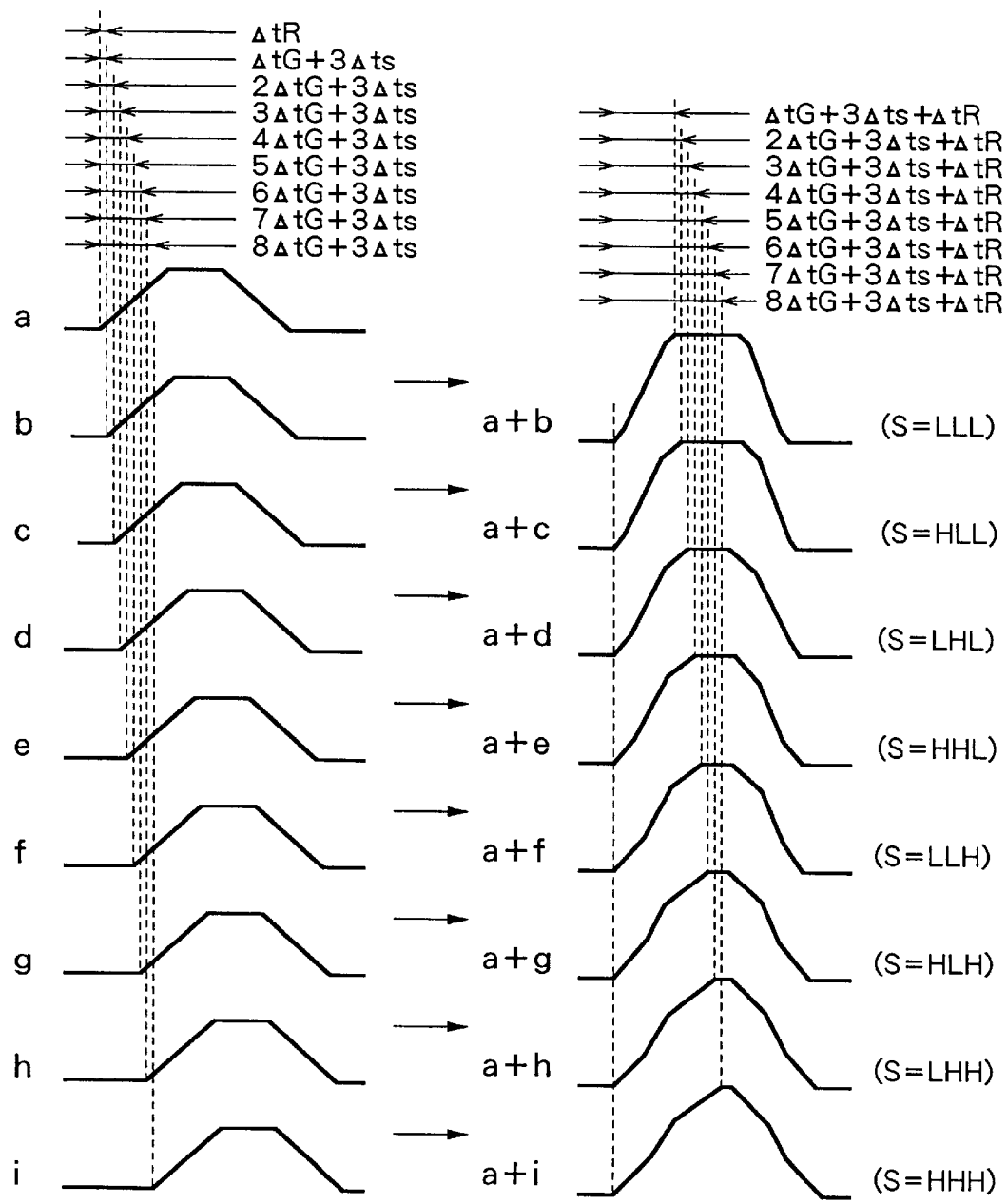
FIG. 8 is a timing chart showing the operation of the third embodiment of the bus driver circuit according to the present invention.

Comparing these waveforms with the waveform obtained at the collector output portion of the NPN transistor 81 shown in (a) of FIG. 8, when S=LLL shown in (b) of FIG. 8, the delay of the waveform becomes "ΔtG+3ΔtS". When S=HLL shown in (c) of FIG. 8, the delay of the waveform becomes "2ΔtG+3ΔtS". When S=LHL shown in (d) of FIG. 8, the delay of the waveform becomes "3ΔtG+3ΔtS". When S=HHL shown in (e) of FIG. 8, the delay of the waveform becomes "4ΔtG+3ΔtS". When S=LLH shown in (f) of FIG. 8, the delay of the waveform becomes "5ΔtG+3ΔtS". When S=HLL shown in (g) of FIG. 8, the delay of the waveform becomes "5ΔtG+3ΔtS". When S=HLH shown in (g) of FIG. 8, the delay of the waveform becomes "6ΔtG+3ΔtS". When S=LHH shown in (h) of FIG. 8, the delay of the waveform becomes "7ΔtG+3ΔtS". When S=HHH shown in (i) of FIG. 8, the delay of the waveform becomes "8ΔtG+3ΔtS".

At this time, the waveform in the output waveform OUT output from the output terminal 100 is superimposing waveform of the waveforms obtained at the collector portion of the NPN transistor 81 and at the collector portion of the NPN transistor and thus having eight mutually distinct rise-up period as shown by a+b, a+c, a+d, a+e, a+f, a+g, a+h and a+i.

The waveform of a+b in FIG. 8 is the superimposed waveform of the waveform (b) of FIG. 8 and the waveform (a) of FIG. 8. This waveform is obtained when S=LLL. The rising timing of this waveform is becomes "ΔtG+3ΔtS+ΔtR". Also, the waveform of a+c of FIG. 8 is the superimposed waveform of the waveform (a) of FIG. 8 and the waveform (c) of FIG. 8. This waveform is obtained when S=HLL. The rising timing of this waveform is becomes "2ΔtG+3ΔtS+ΔtR". The waveform of a+d in FIG. 8 is the superimposed waveform of the waveform (d) of FIG. 8 and the waveform (a) of FIG. 8. This waveform is obtained when S=LHL. The rising timing of this waveform is becomes "3ΔtG+3ΔtS+ΔtR". Also, the waveform of a+e of FIG. 8 is the superimposed waveform of the waveform (a) of FIG. 8 and the waveform (e) of FIG. 8. This waveform is obtained when S=HHL. The rising timing of this waveform is becomes "4ΔtG+3ΔtS+ΔtR". The waveform of a+f in FIG. 8 is the superimposed waveform of the waveform (f) of FIG. 8 and the waveform (a) of FIG. 8. This waveform is obtained when S=LLH. The rising timing of this waveform is becomes "5ΔtG+3ΔtS+ΔtR". Also, the waveform of a+g of FIG. 8 is the superimposed waveform of the waveform (a) of FIG. 8 and the waveform (g) of FIG. 8. This waveform is obtained when S=HLH. The rising timing of this waveform is becomes "6ΔtG+3ΔtS+ΔtR". The waveform of a+h in FIG. 8 is the superimposed waveform of the waveform (h) of FIG. 8 and the waveform (a) of FIG. 8. This waveform is obtained when S=LHH. The rising timing of this waveform is becomes "7ΔtG+3ΔtS+ΔtR". Also, the waveform of a+i of FIG. 8 is the superimposed waveform of the waveform (a) of FIG. 8 and the waveform (i) of FIG. 8. This waveform is obtained when S=HHH. The rising timing of this waveform is becomes "8ΔtG+3ΔtS+ΔtR".

As set forth above, the waveform in the output waveform OUT output from the output terminal 100 is superimposing waveform of the waveforms obtained at the collector portion of the NPN transistor 81 and at the collector portion of the NPN transistor. Accordingly, depending upon the external selection signal S, the output waveform having eight kinds of rise-up period, i.e. a+b, a+c, a+d, a+e, a+f, a+g, a+h and a+i, can be obtained.

Figure 9:
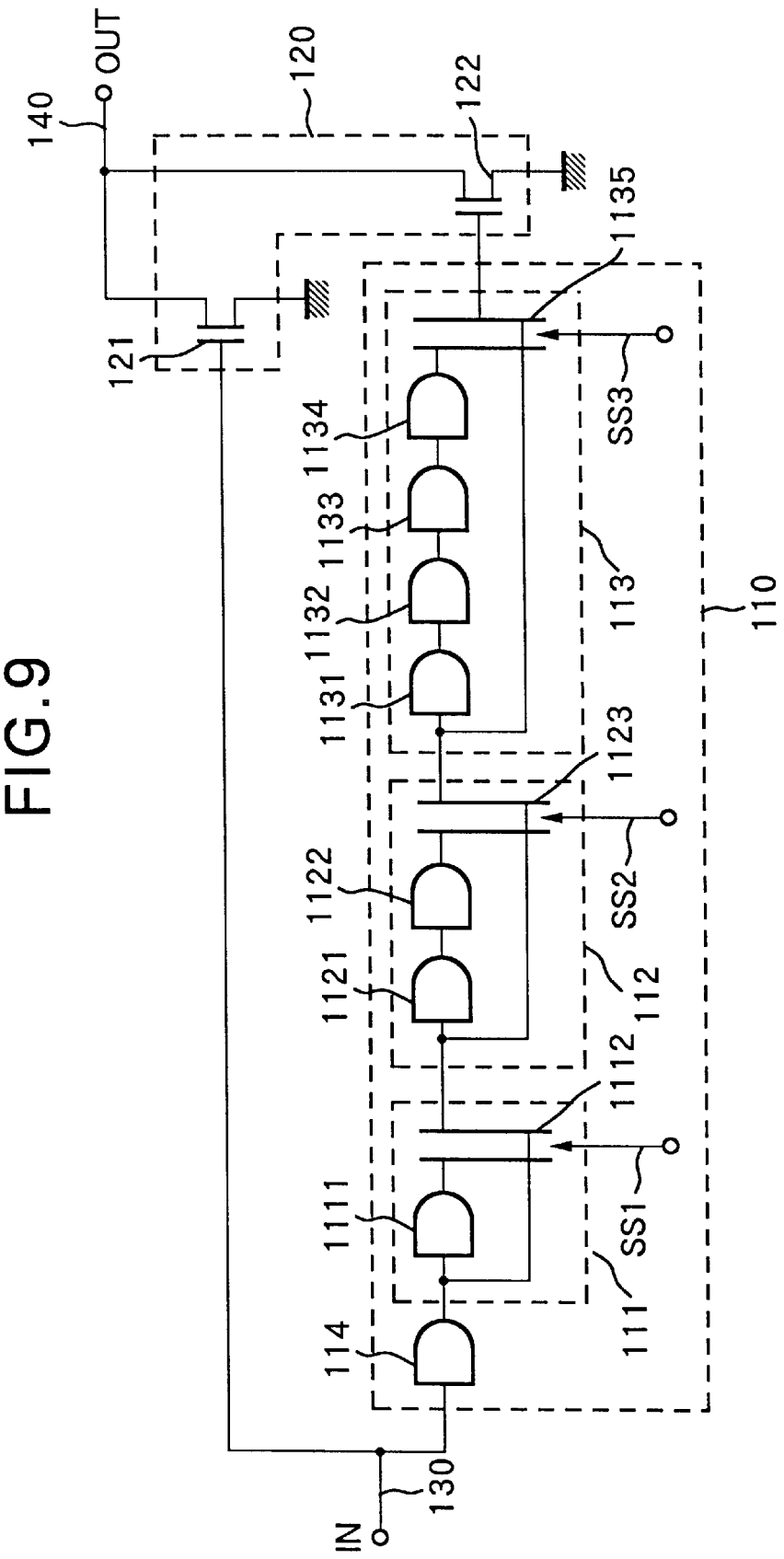
FIG. 9 is a circuit diagram showing the construction of the fourth embodiment of a bus driver circuit according to the present invention.

FIG. 9 is a circuit diagram showing the construction of the fourth embodiment of a bus driver circuit according to the present invention.

In FIG. 9, the shown embodiment of the bus driver circuit comprises an input terminal 130, a delay circuit 120 for generating a delayed signal by delaying the input signal IN input to the input terminal 130, an output circuit 110 for superimposing the input signal IN and the delayed signal, and an output terminal 140 for outputting the output waveform.

The output circuit 140 has two MOS transistors 121 and 122. The base of the MOS transistor 121 is connected to the input terminal 130, emitter thereof is connected to the ground and the collector is connected to the output terminal 140. The base of the MOS transistor 122 is connected to the output of the delay circuit 110, the emitter is connected to the ground and the collector is connected to the output terminal 140. Therefore, the input signal IN input to the input terminal 130 and the delayed signal delayed by the delay circuit are superimposed to each other to be output through the output terminal 140.

Other constructions of the shown embodiment including the delay circuit are the same as those of the third embodiment. Also, the operation of the shown embodiment is substantially the same as the third embodiment.

By this, the output waveform OUT output from the output terminal becomes the waveform, in which the waveform at the collector portion of the MOS transistor 121 and the waveform at the collector portion of the MOS transistor 122. Accordingly, depending upon the external selection signal S, the output waveform having eight kinds of rise-up period, i.e. a+b, a+c, a+d, a+e, a+f, a+g, a+h and a+i, can be obtained.

As set forth above, according to the present invention, since the output signal is generated by superimposing the input signal and the delayed signal obtained by delaying the input signal, the through rate can be adjusted among a plurality of stages depending upon the kind and nature of the data to be transmitted, the transmission speed and the installation condition of other associated board installed. The enables to realize bus driver permitting high speed data transmission.

Figure 10:
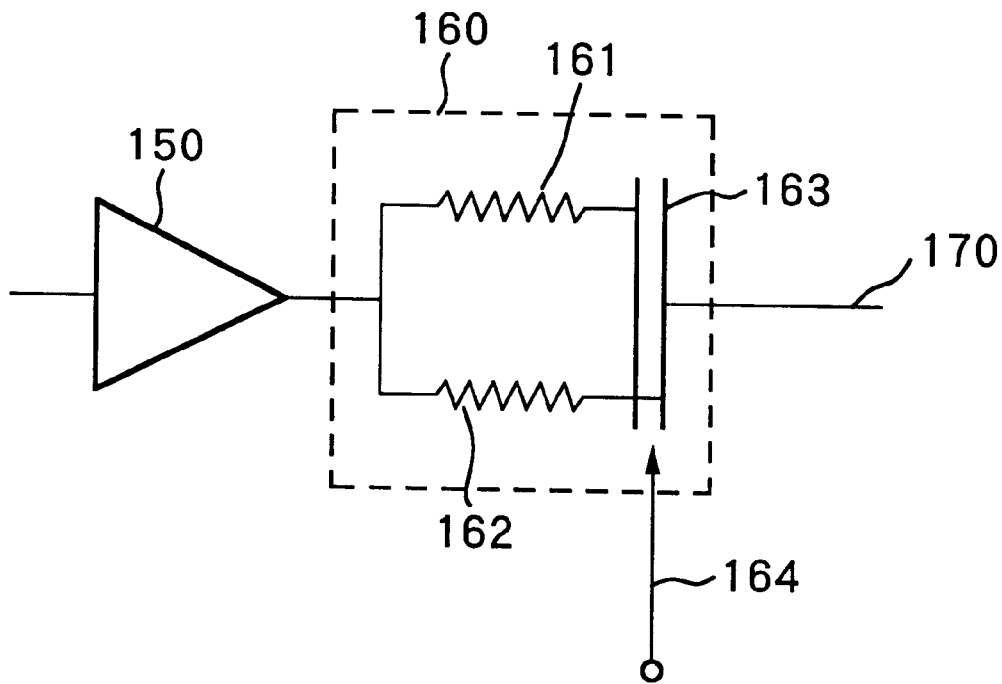
FIG. 10 is a circuit diagram showing the construction of the fifth embodiment of a signal output circuit according to the present invention.

FIG. 10 is a circuit diagram of the preferred construction of a signal output circuit to be cooperated with the foregoing bus driver circuits set forth above for forming a data transmitting or transferring bus system.

In FIG. 1, the shown embodiment of a signal output circuit comprises an output portion 150 for outputting a signal and a variable resistor 160. The output signal of the output portion 150 is supplied to a bus transmission path 170 which is controlled transfer of the data by the bus driver circuit set forth above, through the variable register 160.

The variable resistor 160 includes resistors 161 and 162 and a selector 163. One ends of the resistors 161 and 162 are connected to the output portion 150. On the other hand, the other end of the resistors 161 and 162 are connected to the selector 163. The output signal output from the output portion 150 is input to the selector 163 via the resistors 161 and 162.

The resistors 161 and 162 are selected to have mutually different resistance values. In concrete, the resistor 161 is selected to have an appropriate resistance for correcting excessive characteristic impedance of the bus transmission path. On the other hand, the resistor 162 is selected to have an appropriate resistance for correcting too small characteristic impedance of the bus transmission path. The resistance values of the resistors 161 and 162 are determined on the basis of expected characteristic impedance.

The selector 163 inputs output of the resistor 161, the output of the resistor 162 and the selection signal 164 and selects one of the outputs of the resistors 161 and 162 depending upon the selection signal 164 to output.

Generation of the selection signal 164 can be performed by providing a switch in a selection signal generation circuit and manually switching the switch. Also, it is possible to provide a circuit for monitoring the installation condition of the substrates (not shown) connected to the bus transmission path 170 and generating the selection signal 164 depending upon the installation condition. Here, the installation condition of the substrate represents number of the substrates and the installation position of the substrate.

It should be noted while two kind of resistors are provided in the variable resistor 160, it is possible to provide three or more mutually distinct resistors in the variable resistor.

As set forth above, with the shown embodiment, the signal output circuit which can vary resistance value between the output portion and the bus transmission path with simply operation, can be realized.

Figure 11:
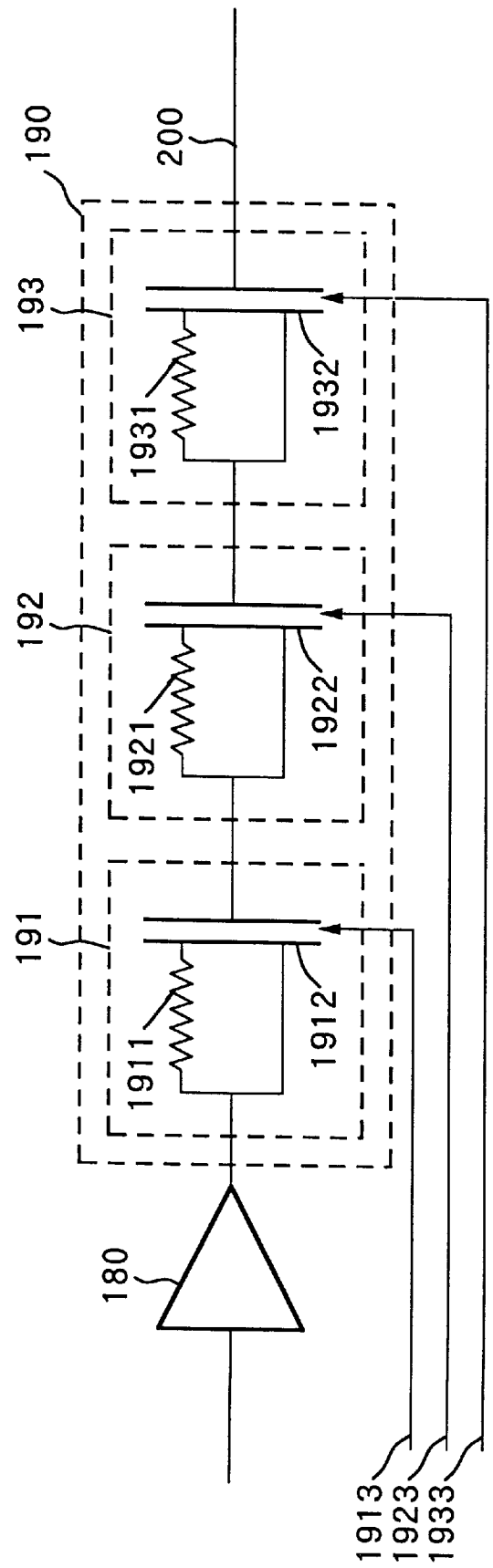
FIG. 11 is a circuit diagram showing the construction of the sixth embodiment of a signal output circuit according to the present invention.
Figure 12:
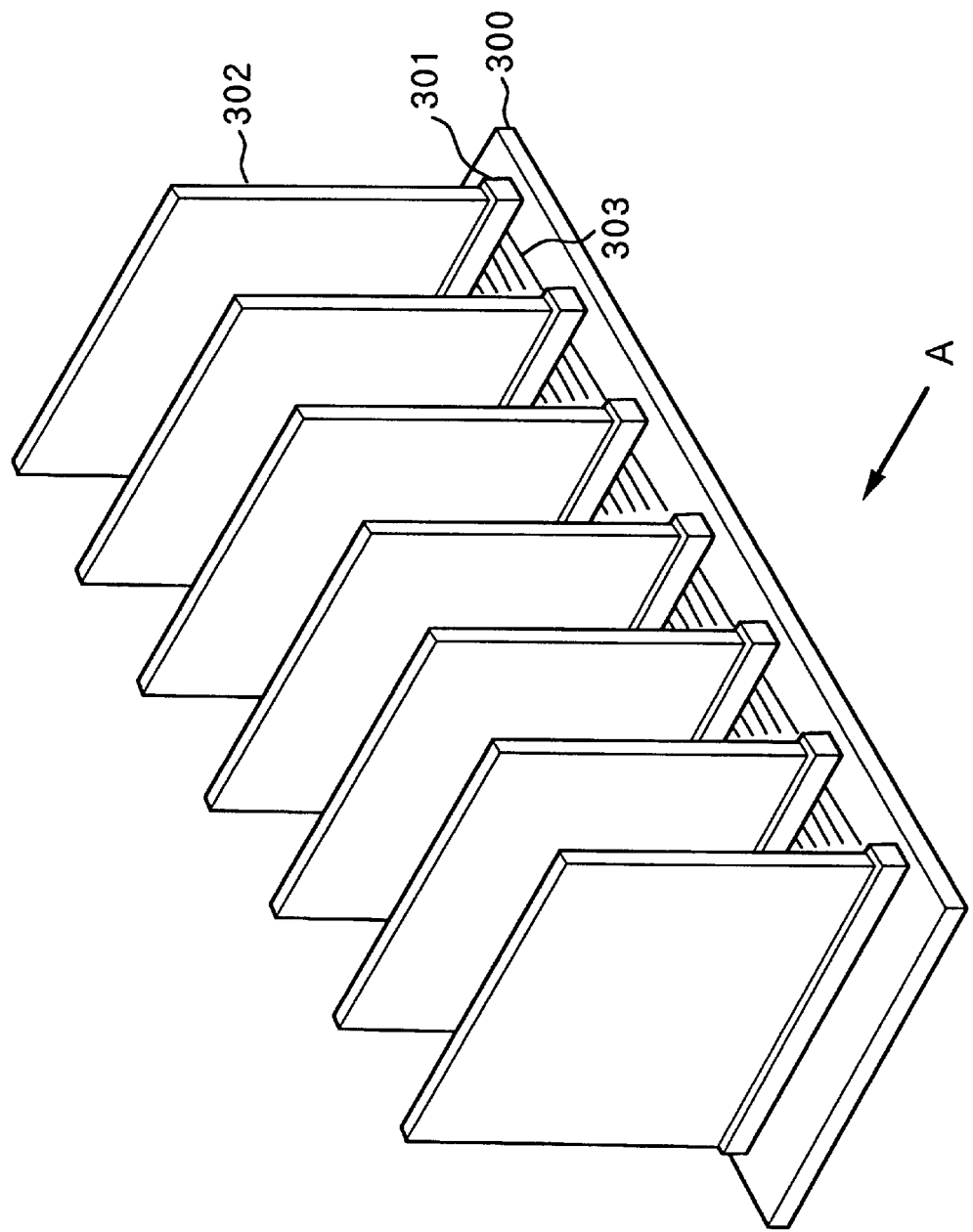
FIG. 12 is an illustration showing a construction of a bus transmission path.
Figure 13:
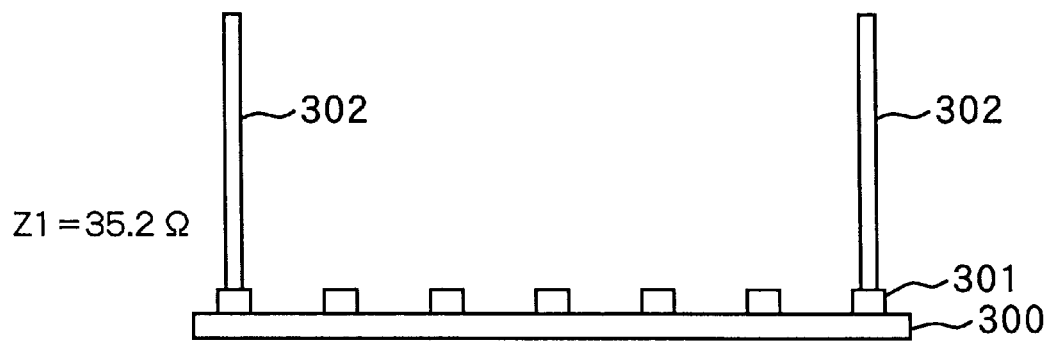
FIG. 13 is an illustration showing correspondence between the installation condition of the substrate to the bus transmission line and the characteristic impedance.
Figure 14:
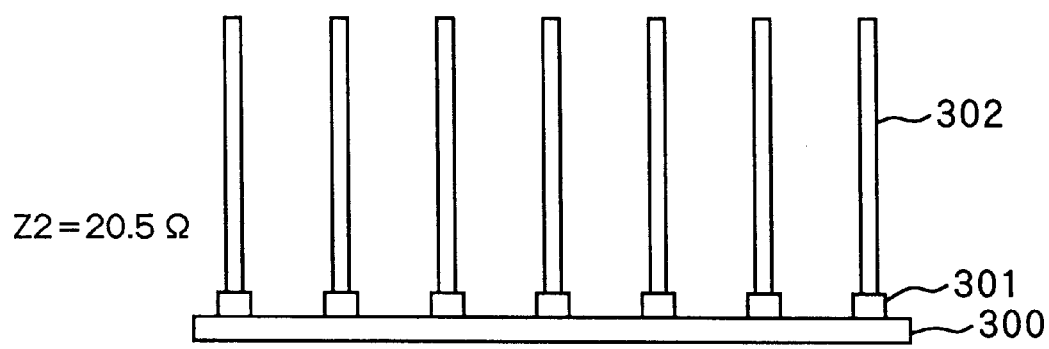
FIG. 14 is an illustration showing correspondence between the installation condition of the substrate to the bus transmission line and the characteristic impedance.
Figure 15:
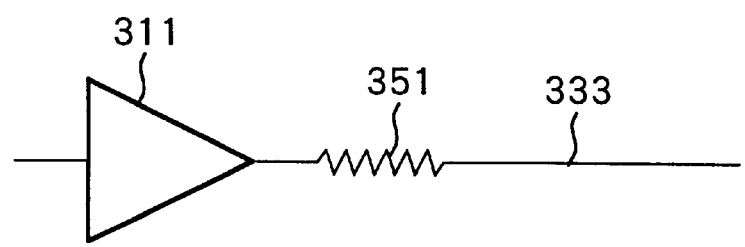
FIG. 15 is a circuit diagram showing the construction of the conventional signal output circuit.

FIG. 11 is a circuit diagram showing a modification of the preferred embodiment of the signal output circuit according to the invention.

In FIG. 11, the shown embodiment of a signal output circuit comprises an output portion 180 and a variable resistor portion 190. The output signal of the output portion 180 is transmitted to the bus transmission path 200 via the variable resistor 190. It should be noted that the output portion 180 and the bus transmission path 200 are the similar to the output portion 150 and the bus transmission path 170 shown in FIG. 10.

The variable resistor 190 includes three resistor blocks 191, 192 and 193. The resistor block 191, 192 and 193 are connected in series. The output signal of the output portion 180 is transmitted to the bus transmission path 200 passing through the resistor blocks 191, 192 and 193 in order.

The block 191 is constructed to have a resistor 1911 and a selector 1912. The resistor 1911 is connected to the output portion 180 at one end and to the selector 1912 at the other end. The output signal output from the output portion 180 is branched into two. One of the divided output signal is input to the selector 1912 via the resistor 1911 and the other is directly input to the selector 1912. Here, the signal past through the resistor 1911 is added the resistance in the extent corresponding to the resistance value of the resistor 1911 in comparison with the signal directly input to the selector 1912. The selector 1912 receives the output signals and the selection signal 1913 and selects one of the two output signals according to the selection signal 1913.

The resistor block 192 is constructed to have the resistor 1931 and the selector 1932. The resistor 1931 is connected to the selector 1912 of the resistor block 191 at one end and to the selector 1932 at the other end. The output signal output from the resistor block 191 is branched into two. One of the divided output signal is input to the selector 1032 via the resistor 1931. Here, the signal past through the resistor 1931 is added the resistance in the extent corresponding to the resistance value of the resistor 1931 in comparison with the signal directly input to the selector 1932. The selector 1932 receives the output signals and the selection signal 1933 and selects one of the two output signals according to the selection signal 1933.

The resistor block 193 is constructed to have the resistor 1931 and the selector 1932. The resistor 1931 is connected to the selector 1922 of the resistor block 192 at one end and to the selector 1932 at the other end. The output signal output from the resistor block 192 is branched into two. One of the divided output signal is input to the selector 1932 via the resistor 1931 and the other is input directly to the selector 1932. Here, the signal past through the resistor 1931 is added the resistance in the extent corresponding to the resistance value of the resistor 1931 in comparison with the signal directly input to the selector 1932. The selector 1932 receives the output signals and the selection signal 1933 and selects one of the two output signals according to the selection signal 1933.

As set forth above, the constructions of the resistor blocks 191, 192 and 193 are the same to each other except for the resistance values of the internal resistors 1911, 1921 and 1931. The resistance value of the resistor 1921 in the resistance block 191 is set at twice greater than the resistance value of the resistor 1911 in the resistance block 191. On the other hand, the resistance value of the resistor 1931 is four times greater than the resistance value of the resistor 1911 of the resistor block 191.

Accordingly, assuming the resistor value of the resistor 1911 is R, the resistance of the resistor 1921 is becomes 2R and the resistance value of the resistor 1931 becomes 4R. Then, by appropriately selecting the selection signal 1913, 1923 and 1933, eight stages, i.e. 0R, 1R, 2R, 3R, 4R, 5R, 6R and 7R of resistance can be created between the output portion 180 and the bus transmission path 200.

Namely, when all of the selector 1912, 1922 and 1932 selects the signal not past through the resistors 1911, 1921 and 1931, the resistance becomes substantially zero. When only selector 1912 performs output with the signal past from the resistor 1911, the resistance value becomes R. When only selector 1922 performs output with the signal past from the resistor 1921, the resistance value becomes 2R. When only selector 1932 selects output with the signal past from the resistor 1931, the resistance value becomes 4R. When only selector 1912 selects output with the signal past from the resistor 1911 and when the selector 1932 selects output with the signal past from the resistor 1931, the resistance value becomes 5R. When only selector 1922 selects output with the signal past from the resistor 1921 and when the selector 1932 selects output with the signal past from the resistor 1931, the resistance value becomes 6R. When all of selectors 1912, 1922 and 1932 select output with the signal past from the resistors 1911, 1921 and 1931, the resistance value becomes 7R.

As set forth above, in the shown embodiment, the signal output circuit which can vary the resistance value between the output portion and the bus transmission path with simple operation can be realized. Furthermore, in the shown embodiment, it is realized the signal output circuit which can achieve greater number of stages of resistances with lesser number of resistors and permits more flexible adjustment of resistance values.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, the foregoing embodiments may be implemented in combination. For instance, variety of combinations may be established between the first and fourth embodiments of the bus driver circuits and the foregoing two embodiments of the signal output circuit for forming the bus system.

What is claimed is:

1. A bus driver circuit for transmitting data onto a bus, comprising:
   an input terminal for inputting an input signal;
   a delay circuit for outputting a delayed signal based on said input signal, said delay circuit generating said delayed signal by receiving at least one selection signal which causes said delay circuit to delay said input signal for one of a plurality of preset delay periods;
   an output circuit for forming an output signal by superimposing the input signal from said input terminal onto said delayed signal from said delay circuit, so that said output signal has a rise time and fall time which defines a waveform shape; and
   an output terminal for outputting the output signal from said output circuit to said bus,
   wherein said one of said plurality of preset delay periods used to generate said delayed signal is selected by said at least one selection signal so that said waveform shape causes said driver circuit to achieve a through rate which is faster than a through rate achieved by selection of any of remaining ones of said plurality of preset delay periods.

2. A device driver circuit as set forth in claim 1, wherein said delay circuit includes a plurality of delay elements and selection means for selecting at least one delay element among said plurality of delay elements.

3. A device driver circuit as set forth in claim 2, wherein said selection means comprises a selector which receives a signal passed through at least one delay element and a signal not passed through said delay element, and selectively outputs one of said signals.

4. A device driver circuit as set forth in claim 1, where in said output circuit includes:
   a first NPN transistor having a base connected to said input terminal, an emitter connected to the ground and a collector, and
   a second NPN transistor which has a base connected to said delay circuit, an emitter connected to a ground and a collector connected to said output terminal.

5. A device driver circuit as set forth in claim 1, wherein said output circuit comprises:
   a first MOS transistor having a gate connected to said input terminal, drain connected to ground and a source; and
   a second MOS transistor having a gate connected to said delay circuit, drain connected to ground and a source connected to said output terminal.

6. A bus driver circuit having adjustable rise and fall times, comprising:
   a data input terminal for receiving an input signal;
   a data output terminal for outputting an output signal;
   a plurality of transition adjusting means for varying a rise and fall transition time for a data transmission between said data input terminal and said data output terminal; and
   a plurality of control signal input terminals corresponding to each of said plurality of transition adjusting means;
   wherein a control signal input into at least one of said plurality of control signal input terminals selectively connects a corresponding one of said transition adjusting means to a path between said data input terminal and said data output terminal to define a rise and fall time for a data transmission between said data input terminal and said data output terminal, and wherein said rise and fall time defined by said corresponding one of said transition adjusting means is one which causes said driver circuit to achieve a through rate which is faster than a through rate that would be achieved by selection of any of remaining ones of said plurality of transition adjusting means.

7. A bus driver circuit having adjustable rise and fall times as recited in claim 6 wherein said transition adjusting means comprises at least one logic gate selectively connected to said path by a switch.

8. A bus driver circuit as set forth in claim 1, wherein said waveform shape defined by said rise time and fall time is a waveform shape that corresponds to a data waveform of said input signal.

9. A bus driver circuit as set forth in claim 1, wherein said waveform shape defined by said rise time and fall time is a waveform shape that causes said output signal to correspond to a characteristic impedance of said bus.

10. A bus driver circuit as set forth in claim 6, wherein said rise and fall time is selectively matched to a data waveform of said input signal.

11. A bus driver circuit as set forth in claim 6, wherein said rise and fall time causes said data transmission to correspond to a characteristic impedance of said bus.

12. A bus driver circuit for outputting data to a bus, comprising:
   an input circuit for receiving an input signal containing data to be transmitted along said bus;
   a delay circuit, connected to said input circuit, for generating a delayed signal based on said input signal, said delayed circuit receiving selection signals for delaying said input signal for one of a plurality of time periods; and
   an output circuit for superimposing said input signal and said delayed signal to produce a data signal having a desired waveform shape for transmission on said bus,
   wherein said waveform shape causes said driver circuit to achieve a through rate which is faster than a through rate that would be achieved by selection of any of remaining ones of said plurality of time periods.

13. A bus driver circuit as set forth in claim 12, wherein said rise time is selectively matched to a data waveform of said input signal.

14. A bus driver circuit as set forth in claim 12, wherein said rise time causes said data signal to correspond to a characteristic impedance of said bus.

15. A bus driver circuit for outputting data to a bus, comprising:
   an input circuit for receiving an input signal containing data to be transmitted along said bus;
   a delay circuit, connected to said input circuit, for generating a delayed signal based on said input signal, said delayed circuit receiving selection signals for delaying said input signal for a predetermined period of time; and
   an output circuit for superimposing said input signal and said delayed signal to produce a data signal for transmission on said bus,
   wherein the superposition of said input signal and delayed signal causes said data signal to have a rise time which enables said data signal to travel along said bus at a desired speed, and
   wherein said delay circuit includes:
      a predetermined number of delay blocks connected in series, each of said delay blocks including at least one delay element and a selector for causing an input into said delay block to either bypass said at least one delay element or pass through said delay element, said selection signals being respectively input into the selectors of said predetermined number of delay blocks to cause said delay circuit to delay said input signal by one of $2^N$ predetermined periods of time, said $2^N$ predetermined period of time including said predetermined period of time.

16. A bus driver circuit as set forth in claim 15, wherein N=3.

17. A bus driver circuit as set forth in claim 15, wherein N is at least three and wherein said selection signals cause non-successive delay blocks to delay said input signal and cause a delay block between said non-successive delay blocks not to delay said input signal.

* * * * *